(12) United States Patent
Muramatsu et al.

(10) Patent No.: US 9,102,005 B2
(45) Date of Patent: Aug. 11, 2015

(54) LASER PROCESSING METHOD

(75) Inventors: Kenichi Muramatsu, Hamamatsu (JP); Takeshi Sakamoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 1152 days.

(21) Appl. No.: 12/094,209

(22) PCT Filed: Nov. 16, 2006

(86) PCT No.: PCT/JP2006/322870
§ 371 (c)(1),
(2), (4) Date: Sep. 16, 2008

(87) PCT Pub. No.: WO2007/060878
PCT Pub. Date: May 31, 2007

(65) Prior Publication Data
US 2009/0008373 A1    Jan. 8, 2009

(30) Foreign Application Priority Data

Nov. 25, 2005  (JP) .............................. P2005-340635

(51) Int. Cl.
*B23K 26/00*   (2014.01)
*B23K 26/16*   (2006.01)
(Continued)

(52) U.S. Cl.
CPC ......... *B23K 26/0057* (2013.01); *B23K 26/4075* (2013.01); *B28D 5/0011* (2013.01); *B28D 5/0094* (2013.01); *H01L 21/78* (2013.01); *B23K 2201/40* (2013.01); *H01L 21/6838* (2013.01)

(58) Field of Classification Search
CPC .......... B23K 2201/40; B23K 26/0057; B23K 26/4075; B28D 5/0011; B28D 5/0094; H01L 21/6838; H01L 21/78

USPC ............................... 219/121.6–121.86; 279/3
See application file for complete search history.

(56) References Cited

U.S. PATENT DOCUMENTS 4,906,011 A * 3/1990 Hiyamizu et al. ................. 279/3
4,921,564 A * 5/1990 Moore .......................... 156/701
(Continued)

FOREIGN PATENT DOCUMENTS

CN    1611319 A    5/2005
JP    7-78864      3/1995
(Continued)

OTHER PUBLICATIONS

K. Hayashi; "Inner Glass Marking by Harmonics of Solid-State Laser", Proceedings of 45th Laser Materials Processing Conference, Dec. 1998, pp. 23-28.
(Continued)

*Primary Examiner* — Sang Y Paik
(74) *Attorney, Agent, or Firm* — Drinker Biddle & Reath LLP

(57) ABSTRACT

A laser processing method which can prevent an object to be processed from being cut along a line to cut from a modified region acting as a cutting start point when separating a suction table and a holding member from each other is provided. An expandable tape 23 holding an object to be processed 1 while being stuck to a frame 51 is secured by suction onto a suction table 52 of a vacuum chuck with a porous sheet 53 interposed therebetween. Since the sheet 53 has a Young's modulus lower than that of the table 52, the tape 23 is restrained from biting into fine pores of the sheet 53. As a consequence, even when the table 52 and tape 23 are separated from each other by releasing the suction securing after forming a modified region 7, no strong bending stress acts on the object 1. This can prevent the object 1 from being cut along a line to cut from the modified region 7 acting as a cutting start point when separating the table 52 and tape 23 from each other.

11 Claims, 20 Drawing Sheets

(51) Int. Cl.
*B23K 26/40* (2014.01)
*B28D 5/00* (2006.01)
*H01L 21/78* (2006.01)
*H01L 21/683* (2006.01)

(56) References Cited

U.S. PATENT DOCUMENTS

| | | | |
|---|---|---|---|
| 6,960,813 B2 * | 11/2005 | Liu | 257/414 |
| 6,992,026 B2 | 1/2006 | Fukuyo et al. | |
| 7,396,742 B2 | 7/2008 | Fukuyo et al. | |
| 7,489,454 B2 | 2/2009 | Fukuyo et al. | |
| 7,547,613 B2 | 6/2009 | Fukuyo et al. | |
| 7,566,635 B2 | 7/2009 | Fujii et al. | |
| 7,592,237 B2 | 9/2009 | Sakamoto et al. | |
| 7,592,238 B2 | 9/2009 | Fukuyo et al. | |
| 7,605,344 B2 | 10/2009 | Fukumitsu | |
| 7,608,214 B2 | 10/2009 | Kuno et al. | |
| 7,615,721 B2 | 11/2009 | Fukuyo et al. | |
| 7,626,137 B2 | 12/2009 | Fukuyo et al. | |
| 7,709,767 B2 | 5/2010 | Sakamoto | |
| 7,718,510 B2 | 5/2010 | Sakamoto et al. | |
| 7,719,017 B2 | 5/2010 | Tanaka | |
| 7,732,730 B2 | 6/2010 | Fukuyo et al. | |
| 7,749,867 B2 | 7/2010 | Fukuyo et al. | |
| 7,754,583 B2 | 7/2010 | Sakamoto | |
| 7,825,350 B2 | 11/2010 | Fukuyo et al. | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 7,947,574 B2 | 5/2011 | Sakamoto et al. | |
| 2004/0029362 A1 | 2/2004 | Liu | |
| 2005/0109742 A1 * | 5/2005 | Nagai et al. | 219/121.73 |
| 2005/0202596 A1 | 9/2005 | Fukuyo et al. | |
| 2005/0272223 A1 | 12/2005 | Fujii et al. | |
| 2006/0144828 A1 | 7/2006 | Fukumitsu et al. | |
| 2006/0148212 A1 | 7/2006 | Fukuyo et al. | |
| 2006/0255024 A1 | 11/2006 | Fukuyo et al. | |
| 2007/0085099 A1 | 4/2007 | Fukumitsu et al. | |
| 2007/0125757 A1 | 6/2007 | Fukuyo et al. | |
| 2007/0158314 A1 | 7/2007 | Fukumitsu et al. | |
| 2007/0252154 A1 | 11/2007 | Uchiyama et al. | |
| 2008/0035611 A1 | 2/2008 | Kuno et al. | |
| 2008/0037003 A1 | 2/2008 | Atsumi et al. | |
| 2008/0090382 A1 | 4/2008 | Fujii et al. | |
| 2008/0218735 A1 | 9/2008 | Atsumi et al. | |
| 2008/0251506 A1 | 10/2008 | Atsumi et al. | |
| 2009/0032509 A1 | 2/2009 | Kuno et al. | |
| 2009/0098713 A1 | 4/2009 | Sakamoto | |
| 2009/0107967 A1 | 4/2009 | Sakamoto et al. | |
| 2009/0117712 A1 | 5/2009 | Sakamoto et al. | |
| 2009/0166342 A1 | 7/2009 | Kuno et al. | |
| 2009/0166808 A1 | 7/2009 | Sakamoto et al. | |
| 2009/0250446 A1 | 10/2009 | Sakamoto | |
| 2009/0261083 A1 | 10/2009 | Osajima et al. | |
| 2009/0302428 A1 | 12/2009 | Sakamoto et al. | |
| 2010/0006548 A1 | 1/2010 | Atsumi et al. | |
| 2010/0009547 A1 | 1/2010 | Sakamoto | |
| 2010/0012632 A1 | 1/2010 | Sakamoto | |
| 2010/0012633 A1 | 1/2010 | Atsumi et al. | |
| 2010/0015783 A1 | 1/2010 | Fukuyo et al. | |
| 2010/0025386 A1 | 2/2010 | Kuno et al. | |
| 2010/0032418 A1 | 2/2010 | Kuno et al. | |
| 2010/0055876 A1 | 3/2010 | Fukuyo et al. | |
| 2010/0151202 A1 | 6/2010 | Fukumitsu | |
| 2010/0176100 A1 | 7/2010 | Fukuyo et al. | |
| 2010/0184271 A1 | 7/2010 | Sugiura et al. | |
| 2010/0200550 A1 | 8/2010 | Kumagai | |
| 2010/0203678 A1 | 8/2010 | Fukumitsu et al. | |
| 2010/0203707 A1 | 8/2010 | Fujii et al. | |
| 2010/0227453 A1 | 9/2010 | Sakamoto | |
| 2010/0240159 A1 | 9/2010 | Kumagai et al. | |
| 2010/0258539 A1 | 10/2010 | Sakamoto | |
| 2010/0301521 A1 | 12/2010 | Uchiyama | |
| 2010/0311313 A1 | 12/2010 | Uchiyama | |
| 2010/0327416 A1 | 12/2010 | Fukumitsu | |
| 2011/0000897 A1 | 1/2011 | Nakano et al. | |
| 2011/0001220 A1 | 1/2011 | Sugiura et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2011/0274128 A1 | 11/2011 | Fukumitsu et al. | |

FOREIGN PATENT DOCUMENTS

| | | |
|---|---|---|
| JP | 9-22935 | 1/1997 |
| JP | 11-010472 A | 1/1999 |
| JP | 2001-196330 A | 7/2001 |
| JP | 2001-203173 A | 7/2001 |
| JP | 2004-111427 | 4/2004 |
| JP | 2004-158859 | 6/2004 |
| JP | 2004-179302 | 6/2004 |
| JP | 2004-311793 A | 11/2004 |
| JP | 2005-109044 A | 4/2005 |
| JP | 2005-228794 A | 8/2005 |
| JP | 2005-262249 | 9/2005 |
| JP | 2006-186263 | 7/2006 |
| KR | 10-2005-0083969 A | 8/2005 |
| TW | 200518269 | 6/2005 |
| WO | WO-2004/090962 A1 | 10/2004 |

OTHER PUBLICATIONS

K. Miura et al., "Formation of Photo-Induced Structures in Glasses with Femtosecond Laser", Proceedings of $42^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner

LASER PROCESSING METHOD

TECHNICAL FIELD

The present invention relates to a laser processing method used for cutting an object to be processed along a line to cut.

BACKGROUND ART

Conventionally known as a laser processing method of this kind is one in which an expandable holding member (expandable tape or the like) holding a wafer-like object to be processed is directly secured by suction onto a suction table of a vacuum chuck, and the object is irradiated with laser light while locating a converging point within the object, so as to form a modified region within the object along a line to cut (see, for example, Patent Document 1).
Patent Document 1: Japanese Patent Application Laid-Open No. 2004-179302

DISCLOSURE OF THE INVENTION

Problem to be Solved by the Invention

However, the following problem may occur in laser processing methods such as the one mentioned above. Namely, the holding member is directly secured onto the suction table by suction and thus bites into fine pores of the suction table, thereby keeping close contact with the suction table even when the suction securing is released after forming the modified region. If the suction table and holding member are forcibly separated from each other in such a state, a strong bending stress will act on the object held by the holding member, thereby cutting the object along the line to cut from the modified region acting as a cutting start point. Since the holding member is not expanded at this time, cut sections of the cut object rub against each other, thereby producing particles.

In view of such circumstances, it is an object of the present invention to provide a laser processing method which can prevent the object from being cut along the line to cut from the modified region acting as a cutting start point when separating the suction table and holding member from each other.

Means for Solving Problem

For achieving the above-mentioned object, the laser processing method in accordance with the present invention includes the step of securing a holding member holding a wafer-like object to be processed onto a suction table of a vacuum chuck by suction while interposing a porous sheet therebetween, and irradiating the object with laser light while locating a converging point within the object, so as to form a modified region to become a cutting start point within the object along a line to cut in the object; wherein the sheet has a Young's modulus lower than that of the suction table.

In this laser processing method, a holding member holding a wafer-like object to be processed is secured by suction onto a suction table of a vacuum chuck while interposing a porous sheet therebetween. At this time, since the Young's modulus of the sheet is lower than that of the suction table, the holding member bites less into fine pores of the sheet than in the case where the holding member is directly secured onto the suction table by suction. As a consequence, even if the suction table and holding member are separated from each other by releasing the suction securing after forming the modified region, no large bending stress will act on the object held by the holding member. Therefore, this laser processing method can prevent the object from being cut along the line to cut from the modified region acting as a cutting start point when separating the suction table and holding member from each other. Also, since the suction table having a Young's modulus higher than that of the sheet exists under the sheet, the flatness of the object can be maintained when securing the holding member by suction, so that the modified region can be formed accurately within the object.

The modified region to become a cutting start point is formed by irradiating the object with laser light while locating a converging point within the object so as to generate optical absorption such as multiphoton absorption within the object.

Preferably, in the laser processing method in accordance with the present invention, the sheet has a coefficient of friction lower than that of the suction table. This can further restrain the holding member from biting into fine pores of the sheet as compared with the case directly securing the holding member onto the suction table by suction.

Preferably, in the laser processing method in accordance with the present invention, the sheet has a thickness of 0.2 mm or less. When the sheet has a thickness of 0.2 mm or less, the flatness of the object at the time of securing the holding member by suction can be maintained more reliably.

Preferably, in the laser processing method in accordance with the present invention, the sheet exhibits a light absorption coefficient lower than that of the suction table with respect to the laser light. Preferably, the sheet exhibits a transmittance higher than that of the suction table with respect to the laser light. Preferably, the sheet exhibits a reflectance higher than that of the suction table with respect to the laser light. These make the temperature rise in the sheet lower than that in the suction table upon irradiation with the laser light, whereby the holding member in contact with the sheet can be prevented from incurring damages such as melting.

Preferably, the laser processing method in accordance with the present invention further comprises the step of cutting the object along the line to cut from the modified region acting as a cutting start point by expanding the holding member after the step of forming the modified region. This can cut the object accurately along the line to cut, while separating cut sections of the cut object from each other, so that particles can be prevented from being produced by the cut sections rubbing against each other.

In the laser processing method in accordance with the present invention, the sheet may be attached to the suction table after the step of forming the modified region. The sheet may be attached to the holding member after the step of forming the modified region and removed from the holding member after the step of cutting the object. The sheet may be attached to the holding member after the step of forming the modified region and removed from the holding member before the step of cutting the object.

Effect of the Invention

The present invention can prevent the object from being cut along the line to cut from the modified region acting as a cutting start point when separating the suction table and holding member from each other.

EXPLANATIONS OF NUMERALS OR LETTERS

1 . . . object to be processed; 5 . . . line to cut; 7 . . . modified region; 23 . . . expandable tape (holding member); 52 . . . suction table; 53 . . . porous sheet; L . . . laser light; P . . . converging point

BEST MODES FOR CARRYING OUT THE INVENTION

In the following, preferred embodiments of the present invention will be explained in detail with reference to the drawings. In the laser processing methods in accordance with the embodiments, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is $1 \times 10^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
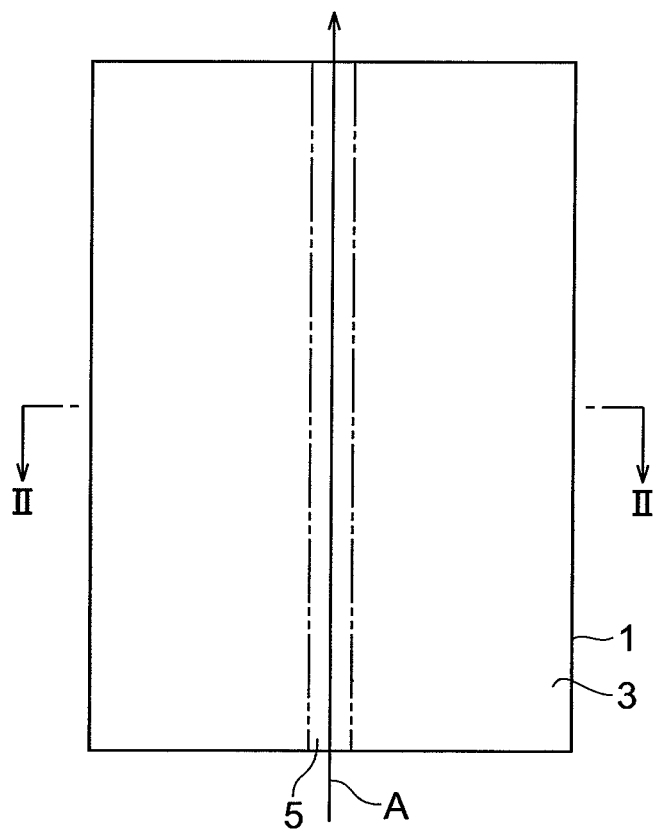
[FIG. 1] is a plan view of an object to be processed during laser processing by the laser processing method in accordance with an embodiment.
Figure 2:
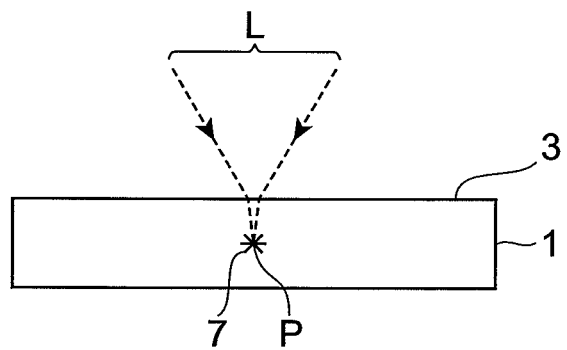
[FIG. 2] is a sectional view of the object taken along the line II-II of FIG. 1.

The principle of the laser processing method in accordance with an embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
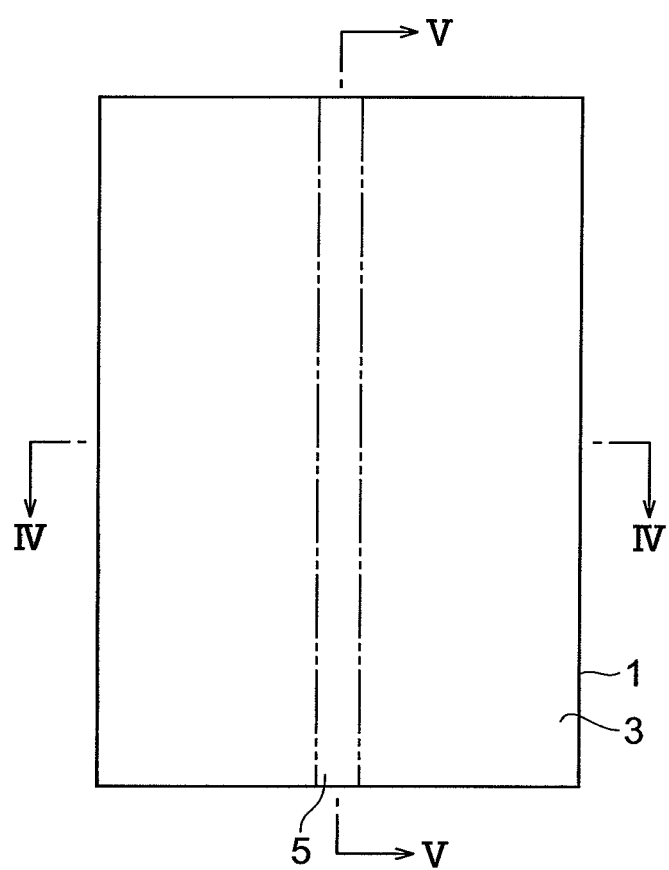
[FIG. 3] is a plan view of the object after the laser processing by the laser processing method in accordance with the embodiment.
Figure 4:
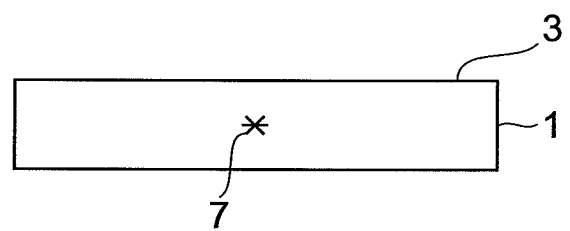
[FIG. 4] is a sectional view of the object taken along the line IV-IV of FIG. 3.
Figure 5:
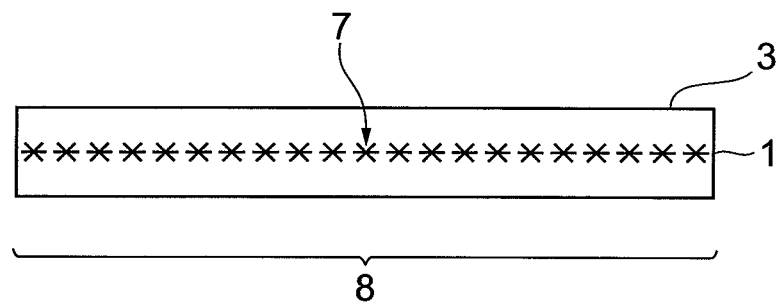
[FIG. 5] is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the front face 3 of the object 1 hardly absorbs the laser light L and thus does not melt.

Figure 6:
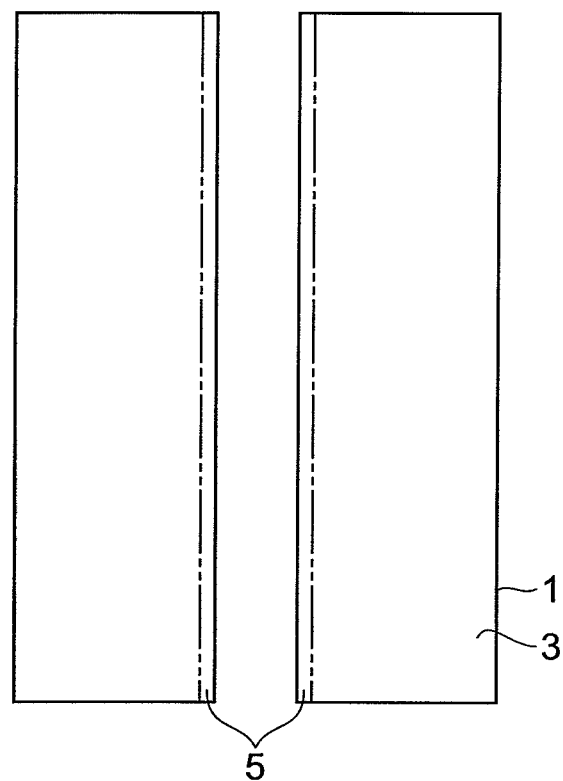
[FIG. 6] is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8 thereof, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as silicon wafer has recently been apt to decrease its thickness.

The modified region formed by multiphoton absorption in the laser processing method in accordance with this embodiment encompasses the following cases (1) to (3):

(1) Case where the Modified Region is a Crack Region Including One Crack or a Plurality of Cracks An object to be processed (e.g., glass or a piezoelectric material made of $LiTaO_3$) is irradiated with laser light while locating a converging point therewithin under a condition with a field intensity of at least $1 \times 10^8$ (W/cm$^2$) at the converging point and a pulse width of 1 µs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser Harmonics", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 µm)

(B) Laser
light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: output<1 mJ/pulse
laser light quality: $TEM_{00}$
polarizing property: linear polarization (C) Condenser lens
transmittance at a laser light wavelength: 60%

(D) Moving rate of the mount table mounting the object: 100 mm/sec

The laser light quality of $TEM_{00}$ means that the converging characteristic is so high that convergence to about the wavelength of laser light is possible.

Figure 7:
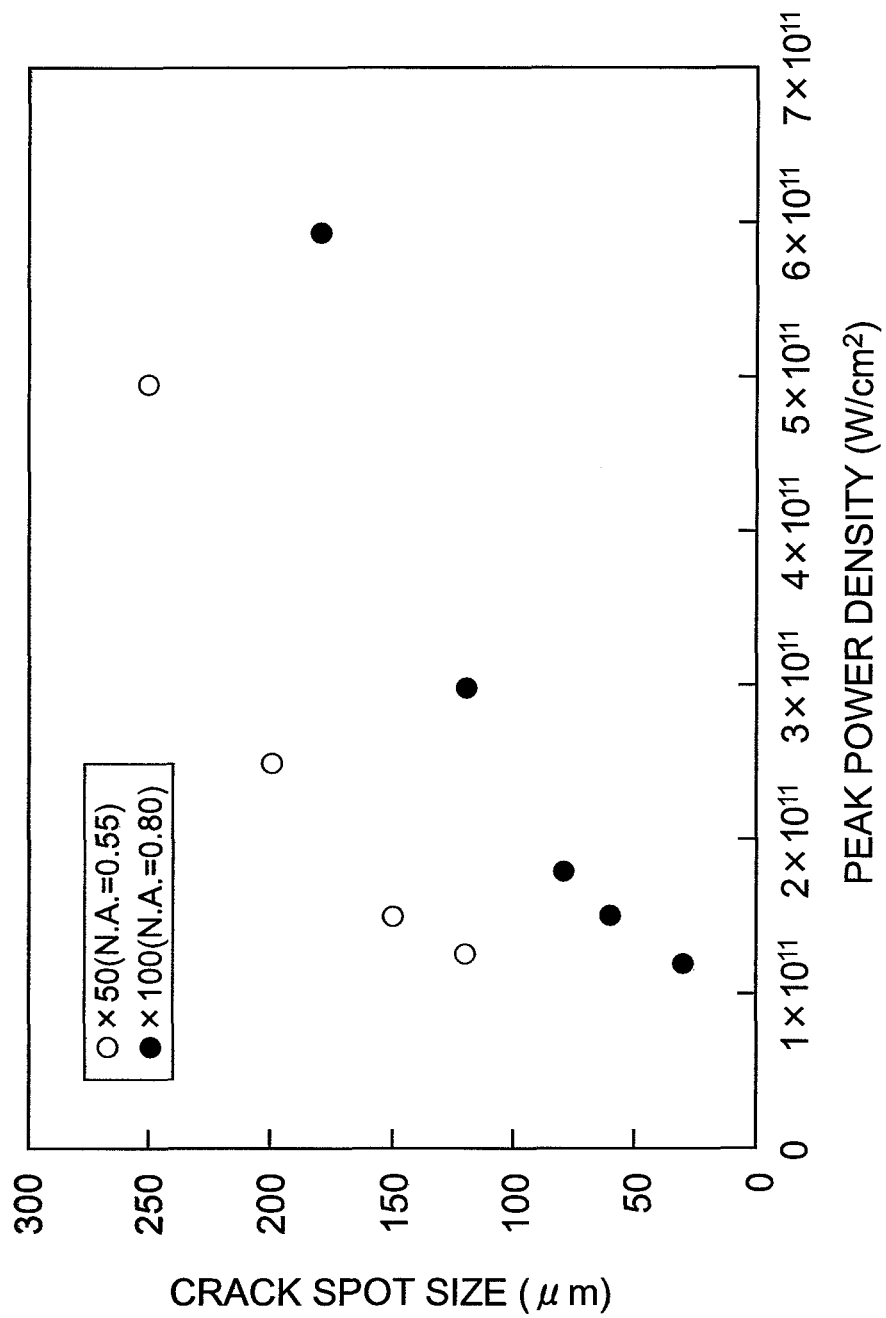
[FIG. 7] is a graph showing relationships between field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
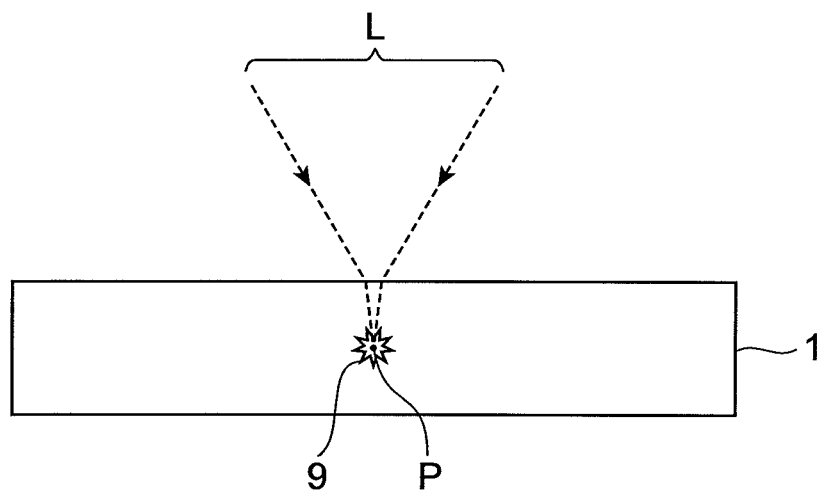
[FIG. 8] is a sectional view of the object in a first step of the laser processing method in accordance with the embodiment.
Figure 9:
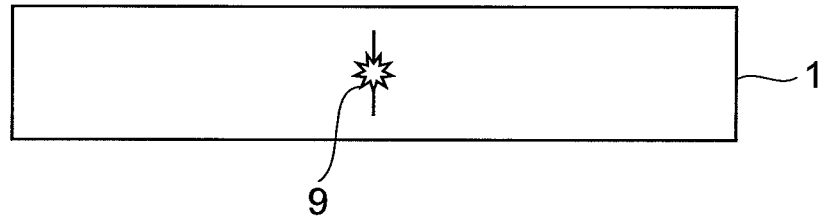
[FIG. 9] is a sectional view of the object in a second step of the laser processing method in accordance with the embodiment.
Figure 10:
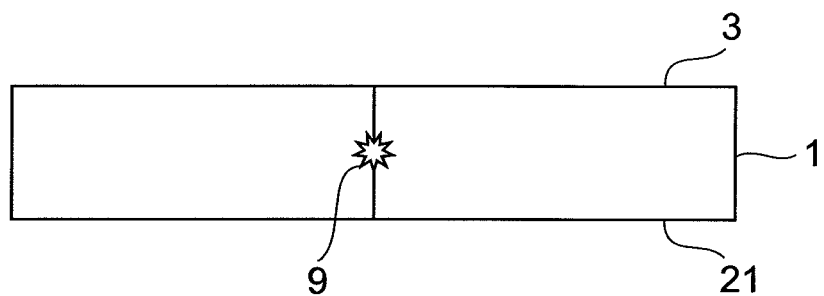
[FIG. 10] is a sectional view of the object in a third step of the laser processing method in accordance with the embodiment.
Figure 11:
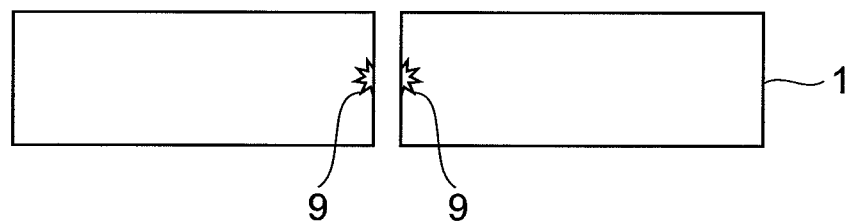
[FIG. 11] is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a converging point within the object under a condition with a field intensity of at least $1 \times 10^8$ (W/cm$^2$) at the converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be processed: silicon wafer (with a thickness of 350 µm and an outer diameter of 4 inches)

Figure 12:
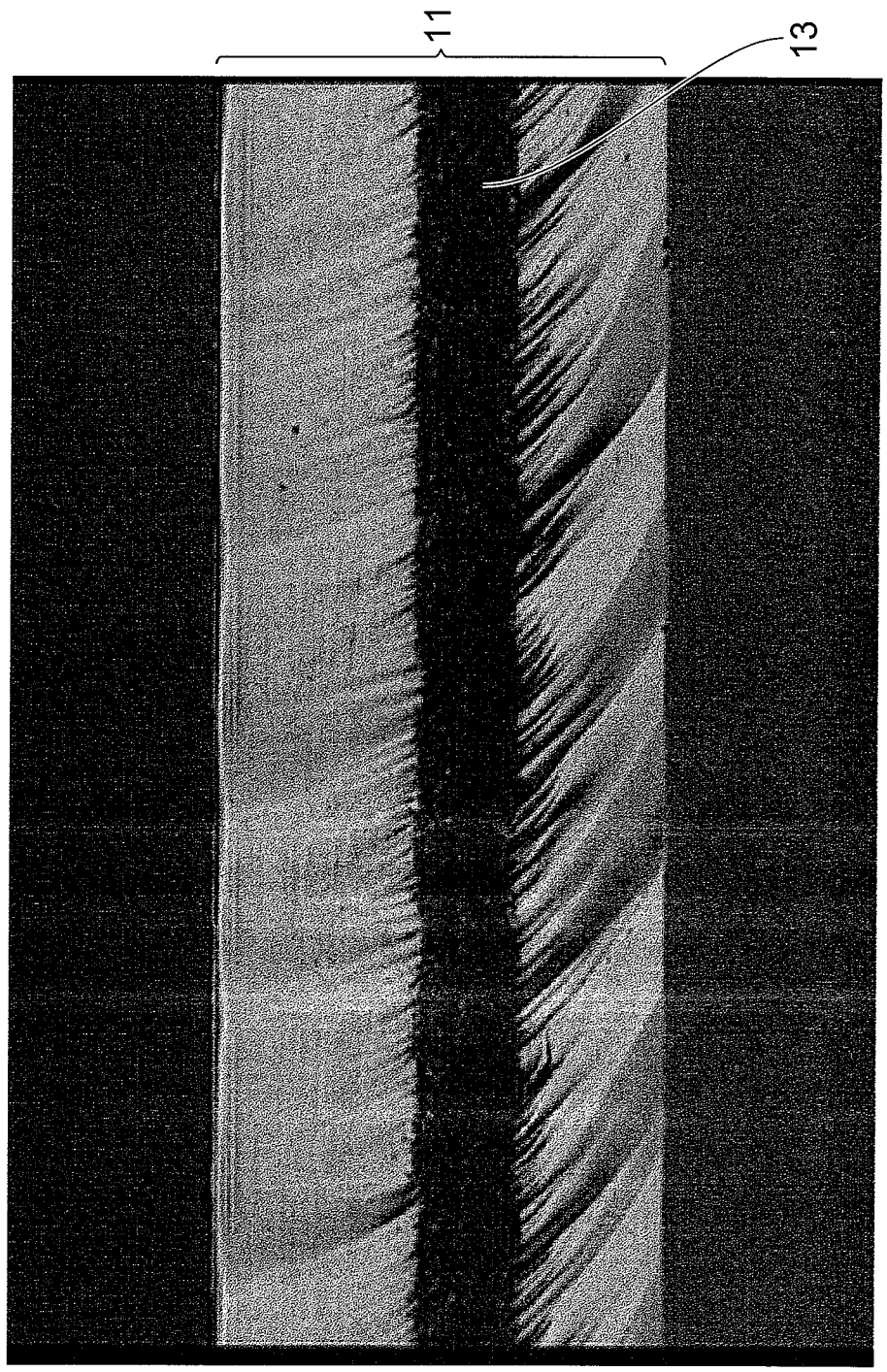
[FIG. 12] is a view showing a photograph of a cut section in a part of a silicon wafer cut by the laser processing method in accordance with the embodiment.

(B) Laser
light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns output: 20 μJ/pulse
laser light quality: TEM$_{00}$
polarizing property: linear polarization
(C) Condenser lens
magnification: ×50
N.A.: 0.55
transmittance at a laser light wavelength: 60%
(D) Moving rate of the mount table mounting the object: 100 mm/sec FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
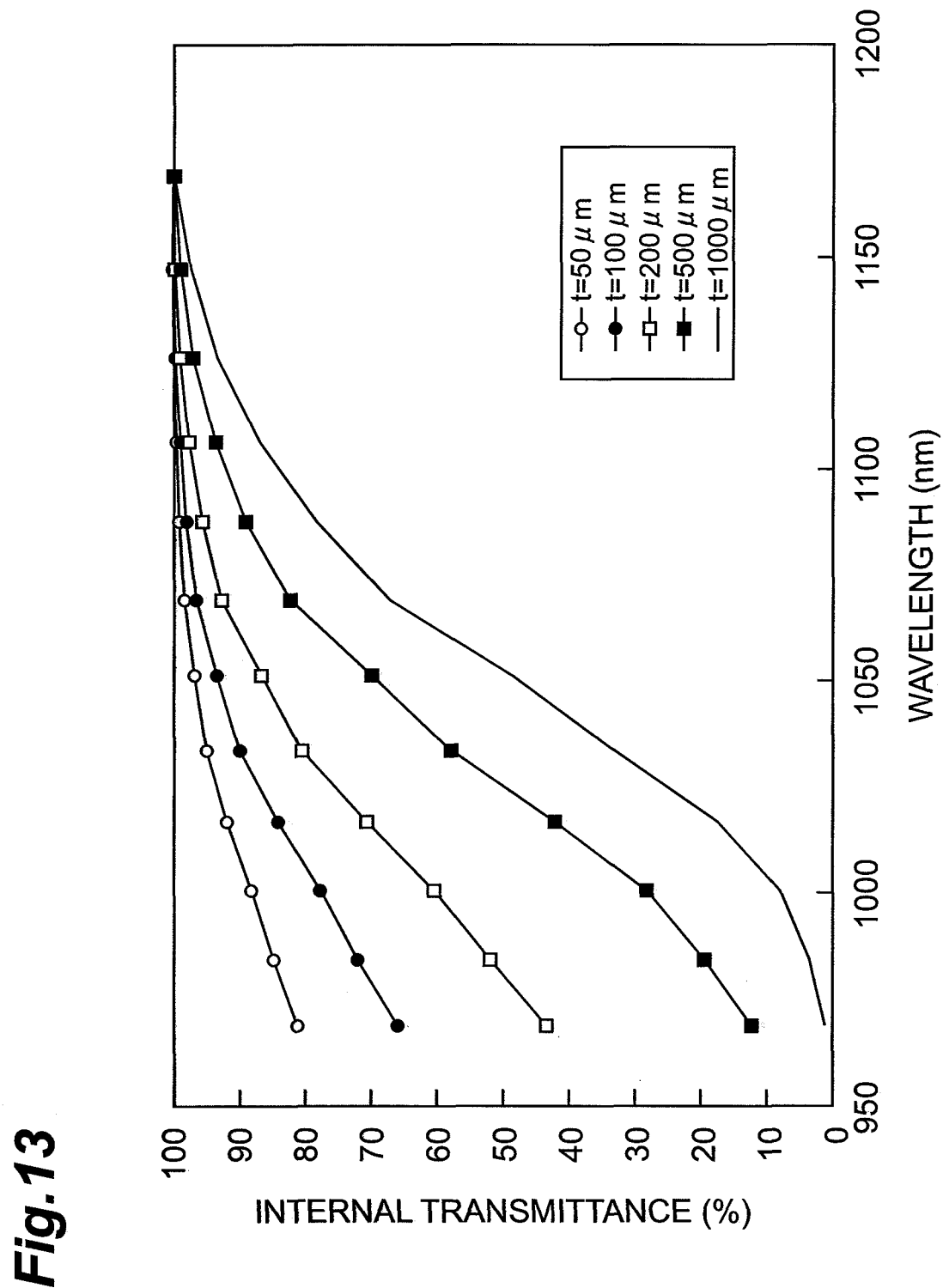
[FIG. 13] is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier. Here, the molten processed region may be formed not only by multiphoton absorption but also by other absorption actions.

(3) Case where the Modified Region is a Refractive Index Change Region

An object to be processed (e.g., glass) is irradiated with laser light while locating a converging point within the object under a condition with a field intensity of at least 1×10$^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is 1×10$^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (3) are explained in the foregoing as modified regions. A starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately with reference to the orientation flat.

A preferred embodiment of the present invention will now be explained.

Figure 14:
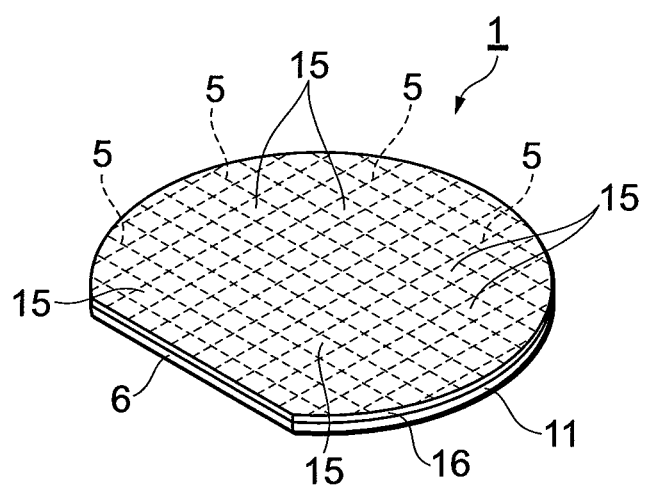
[FIG. 14] is a perspective view of an object to be processed by the laser processing method in accordance with the embodiment.

As shown in FIG. 14, an object to be processed 1 comprises a silicon wafer 11 and a functional device layer 16 which is formed on the front face of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11.

Figure 15:
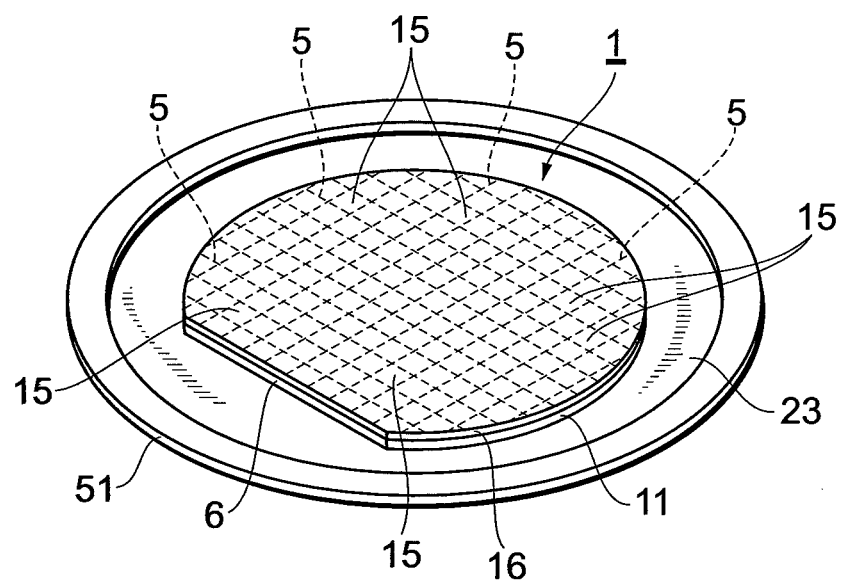
[FIG. 15] is a perspective view showing a state where an expandable tape is attached to the object shown in FIG. 14.

Thus constructed object 1 is cut into the functional devices 15 as follows. First, as shown in FIG. 15, the rear face of the silicon wafer 11 is attached to an expandable tape (holding member) 23 stuck to a ring-shaped frame 51. As a consequence, the object 1 is held by the expandable tape 23.

Figure 16:
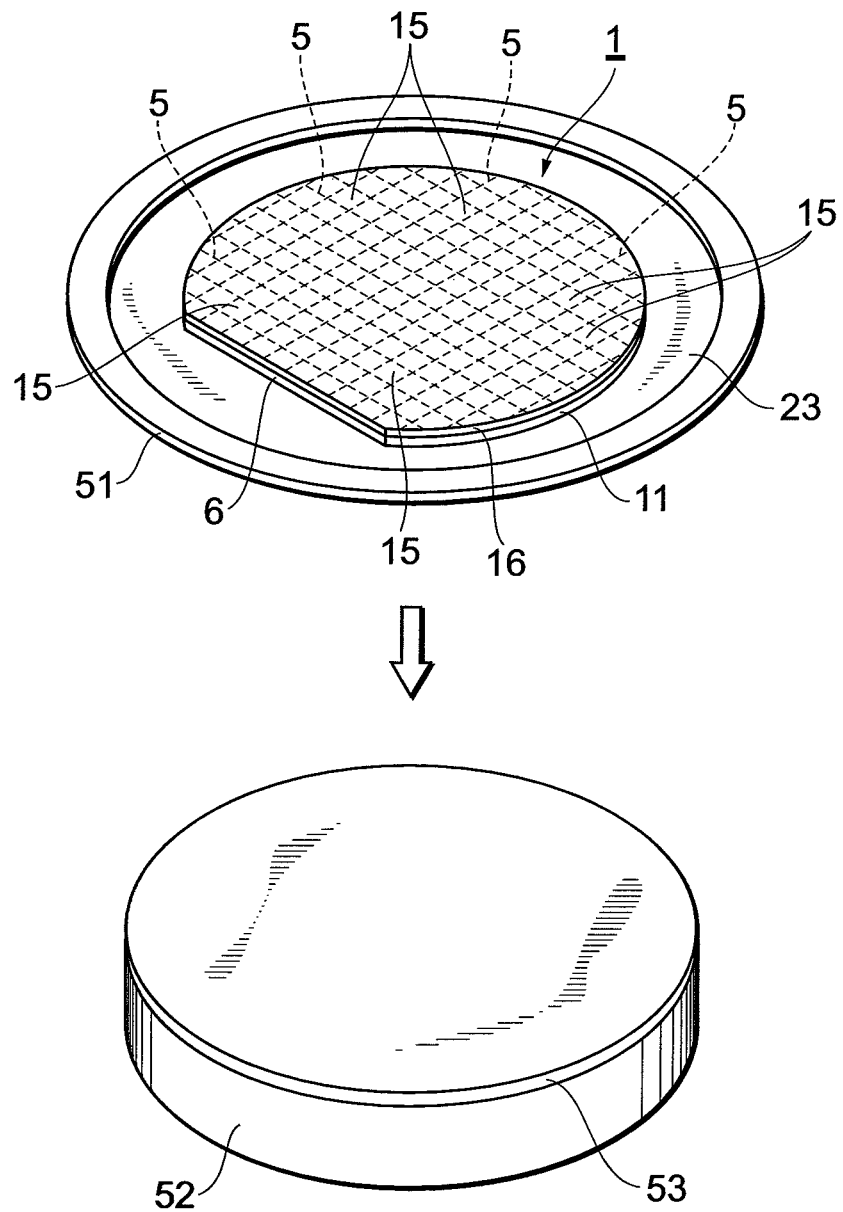
[FIG. 16] is a perspective view showing a state where the object shown in FIG. 14 is about to be secured onto the suction table.

Subsequently, as shown in FIG. 16, the expandable tape 23 holding the object 1 while being stuck to the frame 51 is mounted on a suction table 52 of a vacuum chuck of a laser processing apparatus with a porous sheet 53 interposed therebetween. This secures the object 1 onto the suction table 52.

Here, the porous sheet 53 is secured onto the suction table 52. For example, the suction table 52 is made of a porous ceramic (alumina) and has a Young's modulus of $3.5 \times 10^5$ MPa, an average pore size of 70 μm, and a porosity of 31%. For example, the porous sheet 53 is made of porous polyethylene and has a thickness of 0.2 mm, a Young's modulus of 13.3 MPa, an average pore size of 17 μm, and a porosity of 26%.

Figure 17:
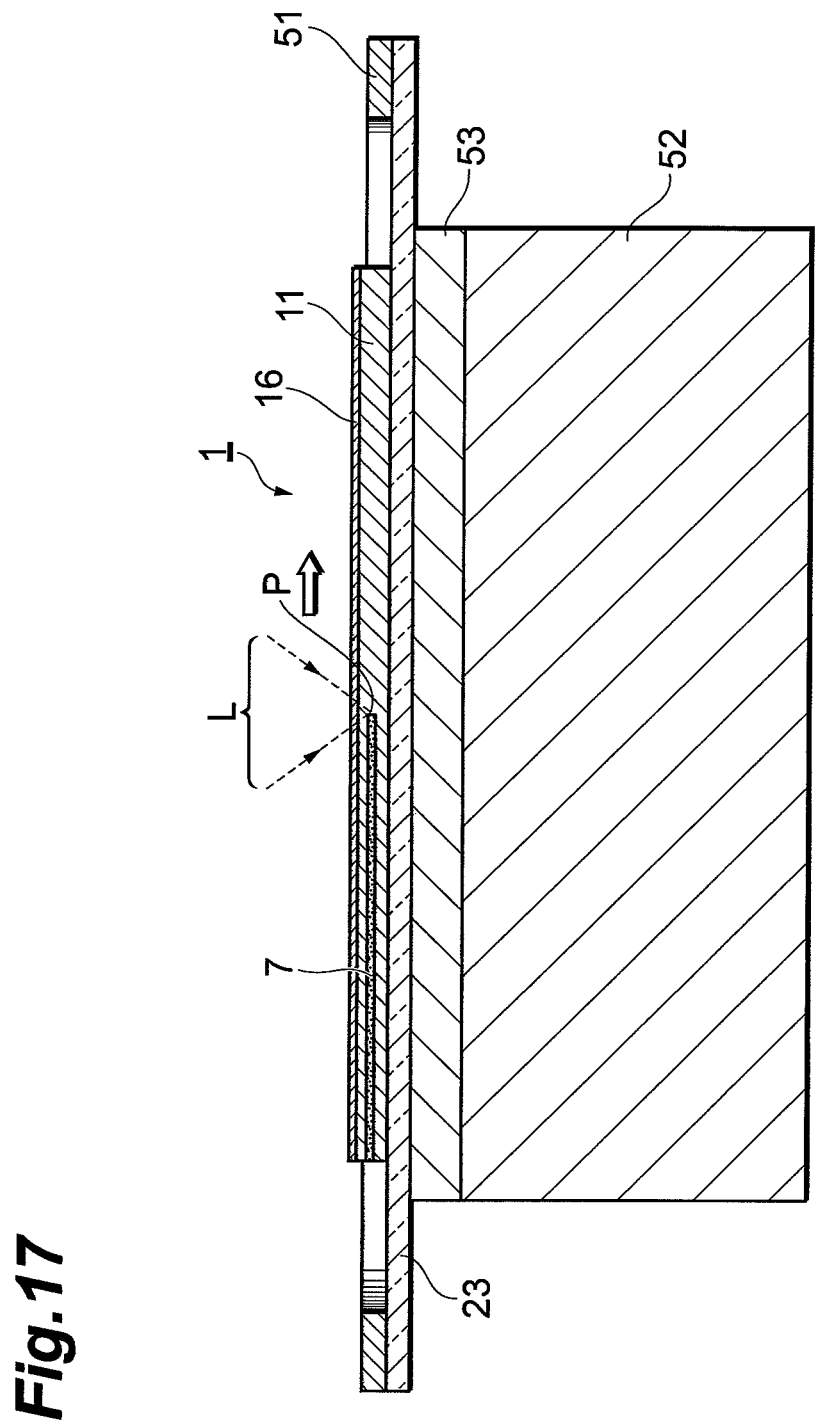
[FIG. 17] is a sectional view taken along a line to cut in a state where the object shown in FIG. 14 is secured on the suction table.

Next, as shown in FIG. 17, the silicon wafer 11 is irradiated with laser light L while using the front face of the silicon wafer 11 as a laser light entrance surface and locating a converging point P within the silicon wafer 11, and the suction table 52 is moved such as to scan the converging point P along lines to cut 5 (see broken lines of FIG. 14) which are set like grids passing between the functional devices 15, 15 adjacent to each other. This forms one or a plurality of rows of modified regions 7 for each line to cut 5. The modified regions 7 are molten processed regions but may include cracks mixed therein.

Figure 18:
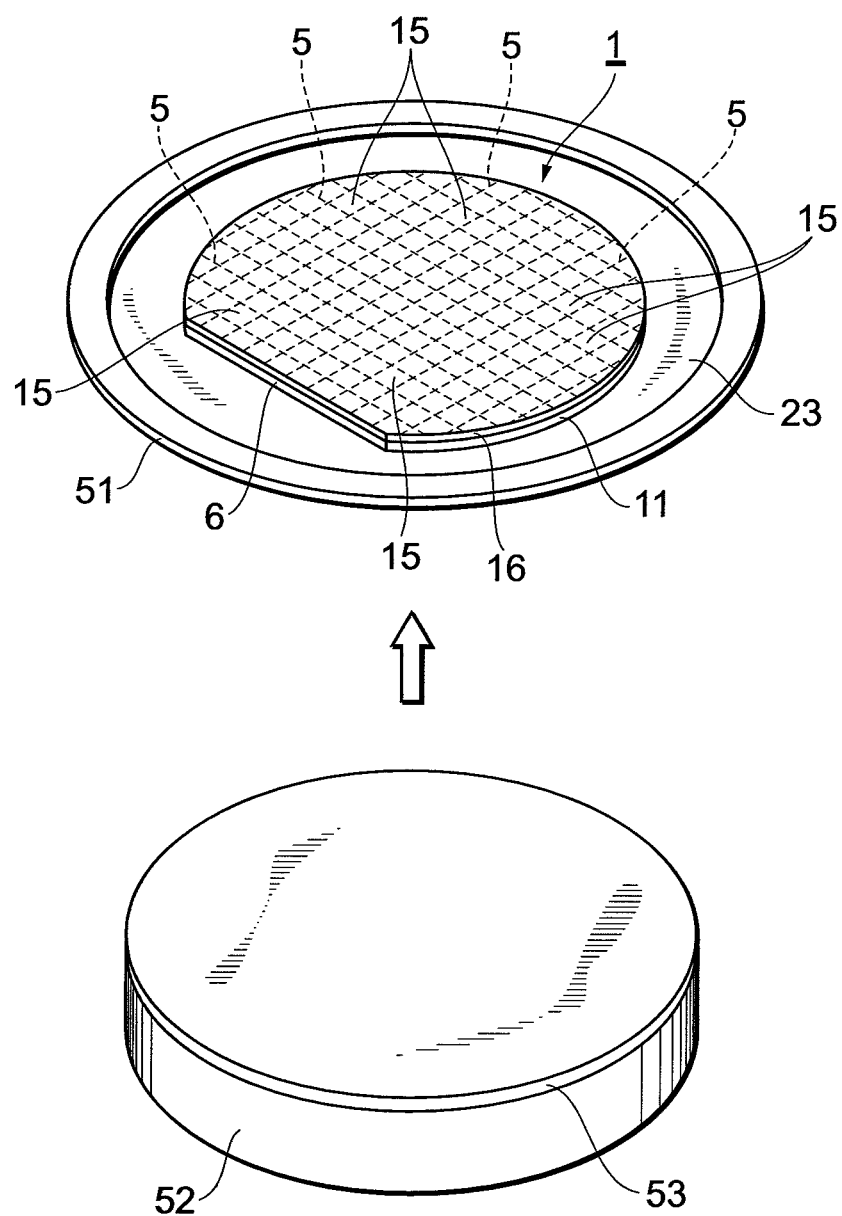
[FIG. 18] is a perspective view showing a state where the object shown in FIG. 14 and the suction table are separated from each other.

Subsequently, as shown in FIG. 18, the suction securing under vacuum is released, so that the porous sheet 53 secured on the suction table 52 and the expandable tape 23 are separated from each other. Then, the expandable tape 23 holding the object 1 while being stuck to the frame 51 is transferred to an expander.

Figure 19:
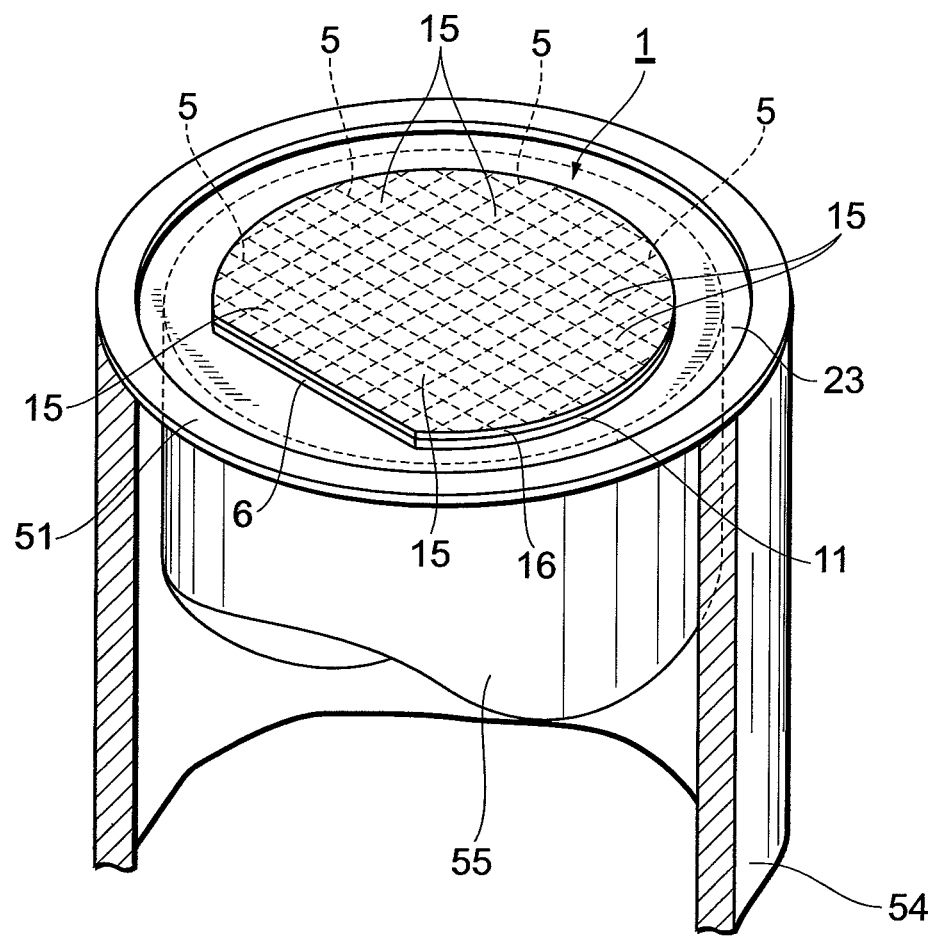
[FIG. 19] is a perspective view showing a state where the object shown in FIG. 14 is set to an expander.

Next, as shown in FIG. 19, the frame 51 stuck to the expandable tape 23 holding the object 1 is secured onto a cylindrical fixing member 54 of the expander. Arranged on the inside of the fixing member 54 is a columnar pressing member 55 for raising and expanding the expandable tape 23.

Figure 20:
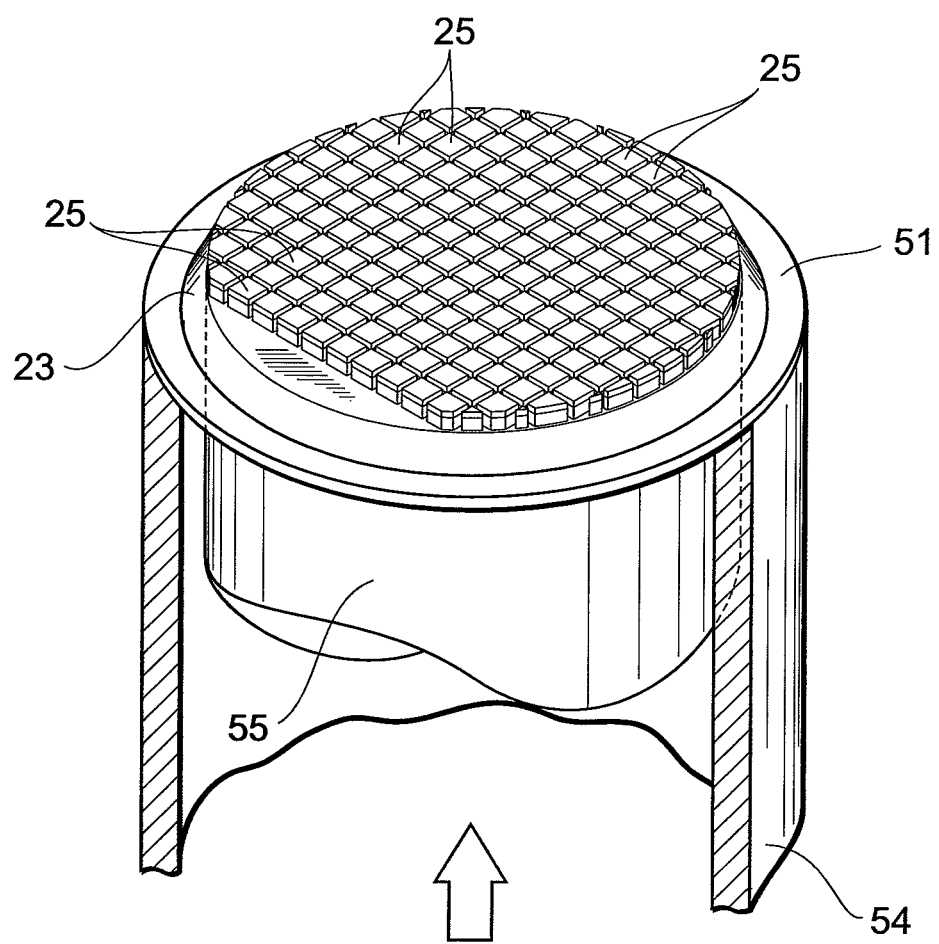
[FIG. 20] is a perspective view showing a state where the object shown in FIG. 14 is cut into semiconductor chips.

Subsequently, as shown in FIG. 20, the pressing member 55 of the expander is moved up, so as to expand the expandable tape 23, thereby generating fractures from the modified regions 7 acting as start points, thus cutting the silicon wafer 11 and functional device layer 16 along the lines to cut 5, while separating individual semiconductor chips 25 obtained by cutting from each other. At this time, cut sections of the semiconductor chips 25 are separated from each other, whereby particles can be prevented from being produced by the cut sections rubbing against each other.

In the above-mentioned laser processing method, as explained in the foregoing, the expandable tape 23 holding the object 1 while being stuck to the frame 51 is secured by suction onto the suction table 52 of the vacuum chuck. Here, since the porous sheet 53 has a Young's modulus lower than that of the suction table 52, the expandable tape 23 bites less into fine pores of the porous sheet 53 than in the case where the expandable tape 23 is directly secured by suction onto the suction table 52. As a consequence, even when the suction table 52 and expandable tape 23 are separated from each other by releasing the suction securing after forming the modified regions 7, no large bending stress acts on the object 1 held by the expandable tape 23. Therefore, the above-mentioned laser processing method can prevent the object 1 from being cut along the lines to cut 5 from the modified regions 7 acting as cutting start points when separating the suction table 52 and expandable tape 23 from each other. Also, since the suction table 52 having a Young's modulus higher than that of the porous sheet 53 exists under the porous sheet 53, the flatness of the object 1 can be maintained when securing the expandable tape 23 by suction, whereby the modified regions 7 can accurately be formed within the object 1.

When the porous sheet 53 has a coefficient of friction lower than that of the suction table 52 in the above-mentioned laser processing method, the expandable tape 23 can further be restrained from biting into fine pores of the porous sheet 53 as compared with the case directly securing the expandable tape 23 onto the suction table 52 by suction.

When the porous sheet 53 has a thickness of 0.2 mm or less in the above-mentioned laser processing method, the flatness of the object 1 at the time of securing the expandable tape 23 by suction can be maintained more reliably.

When the porous sheet 53 exhibits a lower light absorption coefficient, higher transmittance, or higher reflectance with respect to the laser light L as compared with the suction table 52, the temperature rise in the porous sheet 53 becomes lower than that in the suction table 52 upon irradiation with the laser light L, whereby the expandable tape 23 in contact with the porous sheet 53 can be prevented from incurring damages such as melting.

The present invention is not limited to the above-mentioned embodiment.

Though the above-mentioned embodiment relates to a case where the porous sheet 53 is attached and secured onto the suction table 52 after forming the modified regions 7, this is not restrictive. For example, the porous sheet 53 may be transferred while in the state separated from the suction table 52 and attached to the expandable tape 23 after forming the modified regions 7, and peeled off from the expandable tape 23 after cutting the object 1. The porous sheet 53 may also be transferred while in the state separated from the suction table 52 and attached to the expandable tape 23 after forming the modified regions 7, and peeled off from the expandable tape 23 before cutting the object 1. The porous sheet 53 can easily be peeled off from the expandable tape 23 in these cases as well, since the expandable tape 23 is restrained from biting into fine pores of the porous sheet 53.

Though the above-mentioned embodiment relates to a case using the front face of the silicon wafer 11 as a laser light entrance surface, the rear face of the silicon wafer 11 may be employed as the laser entrance surface. When the rear face of the silicon wafer 11 is used as the light entrance surface, a surface protecting member (holding member) such as film is attached to the surface of the functional device layer 16 including the functional devices 15. While protecting the functional devices 15 and holding the object 1, the surface protecting member is mounted and secured by suction under vacuum onto the suction table 52 of the vacuum chuck of the laser processing apparatus with the porous sheet 53 interposed therebetween. Then, the silicon wafer 11 is irradiated with the laser light L while using the rear face of the silicon wafer 11 as the laser light entrance surface and locating the converging point P within the silicon wafer 11, and the converging point P is scanned along each of the lines to cut 5 set like grids passing between the functional devices 15, 15 adjacent to each other. This forms one or a plurality of rows of modified regions 7 for each line to cut 5. Subsequently, the suction securing under vacuum is released, so that the porous sheet 53 secured on the suction table 52 and the surface protecting member are separated from each other. Then, the expandable tape 23 is attached to the rear face of the silicon wafer 11. After peeling off the surface protecting member from the surface of the functional device layer 16, the expandable tape 23 is expanded by the expander, so as to generate fractures from the modified regions 7 acting as start points, thereby cutting the silicon wafer 11 and functional device layer 16 along the lines to cut 5, while separating the semiconductor chips 25 obtained by cutting from each other.

Though the above-mentioned embodiment relates to a case where the functional device layer 16 exists on the lines to cut 5, the front face of the silicon wafer 11 may be used as the laser light entrance surface in a state where the functional device layer 16 does not exist on the lines to cut 5 while exposing the front face of the silicon wafer 11.

INDUSTRIAL APPLICABILITY

The present invention can prevent the object from being cut along the lines to cut from the modified regions acting as cutting start points when separating the suction table and holding member from each other.

The invention claimed is:

1. A laser processing method including the steps of:
securing a wafer-like object to be processed onto an expandable holding member stuck to a frame;
holding the wafer-like object and the expandable holding member onto a porous sheet and a porous suction table of a vacuum chuck by suction, the porous sheet being interposed between the porous suction table and the expandable holding member and being in direct contact with the porous suction table on one side of the porous sheet and being in direct contact with the expandable holding member on the other side of the porous sheet; and
irradiating the object with laser light while locating a converging point within the object, so as to form a modified region to become a cutting start point within the object along a line to cut in the object after the step of holding;
wherein the porous sheet has a Young's modulus lower than that of the suction table and a pore size of the porous sheet is smaller than a pore size of the porous suction table, and
wherein the expandable holding member is subjected to vacuum suction towards the porous sheet via pores of the porous suction table and the porous sheet, respectively.

2. A laser processing method according to claim 1, wherein the sheet has a coefficient of friction lower than that of the suction table.

3. A laser processing method according to claim 1, wherein the sheet has a thickness of 0.2 mm or less.

4. A laser processing method according to claim 1, wherein the sheet exhibits a light absorption coefficient lower than that of the suction table with respect to the laser light.

5. A laser processing method according to claim 1, wherein the sheet exhibits a transmittance higher than that of the suction table with respect to the laser light.

6. A laser processing method according to claim 1, wherein the sheet exhibits a reflectance higher than that of the suction table with respect to the laser light.

7. A laser processing method according to claim 1, further comprising the step of cutting the object along the line to cut from the modified region acting as a cutting start point by expanding the holding member after the step of forming the modified region.

8. A laser processing method according to claim 7, wherein the sheet is attached to the suction table after the step of forming the modified region.

9. A laser processing method according to claim 7, wherein the sheet is attached to the holding member after the step of forming the modified region and removed from the holding member after the step of cutting the object.

10. A laser processing method according to claim 7, wherein the sheet is attached to the holding member after the step of forming the modified region and removed from the holding member before the step of cutting the object.

11. A laser processing method according to claim 1, wherein the expandable holding member includes an expandable tape.

* * * * *